US005627794A

United States Patent [19]
Lee

[11] Patent Number: 5,627,794
[45] Date of Patent: May 6, 1997

[54] SIGNAL TRANSFER CIRCUIT FOR SYNCHRONOUS MEMORY DEVICE

[75] Inventor: Jae J. Lee, Kyoungki-do, Rep. of Korea

[73] Assignee: Hyundai Electronics Industries Co., Ltd., Kyoungki-do, Rep. of Korea

[21] Appl. No.: 641,650

[22] Filed: May 1, 1996

[30] Foreign Application Priority Data

May 2, 1995 [KR] Rep. of Korea ............ 95-10732

[51] Int. Cl.$^6$ ............................ G11C 13/00
[52] U.S. Cl. ................... 365/233; 365/230.02
[58] Field of Search ............. 365/233, 189.05, 365/230.02, 194

[56] References Cited

U.S. PATENT DOCUMENTS

| | | | |
|---|---|---|---|
| 5,287,320 | 2/1994 | Adachi | 365/233 |
| 5,424,982 | 6/1995 | Kato | 365/189.05 |
| 5,495,452 | 2/1996 | Cha | 365/233 |

Primary Examiner—David C. Nelms
Assistant Examiner—Michael T. Tran
Attorney, Agent, or Firm—Reid & Priest L.L.P.

[57] ABSTRACT

A signal transfer circuit for a synchronous memory device, comprising an input terminal for inputting a clock signal, an internal address generator for generating an internal address signal, a multiplexing circuit for selectively transferring an external address signal and the internal address signal from the internal address generator, a multiplexing controller for controlling the operation of the multiplexing circuit in response to the clock signal from the input terminal, an internal circuit for generating a data signal in response to the external or internal address signal transferred by the multiplexing circuit, a data output buffer for buffering the data signal generated by the internal circuit and outputting the buffered data signal externally, an output buffer controller for controlling the operation of the data output buffer in response to the clock signal from the input terminal, a switching circuit connected between the internal circuit and the data output buffer, for performing a switching operation to transfer the data signal from the internal circuit to the data output buffer, and a switching controller for controlling the operation of the switching circuit in response to the clock signal from the input terminal.

18 Claims, 9 Drawing Sheets

SIGNAL TRANSFER CIRCUIT FOR SYNCHRONOUS MEMORY DEVICE

BACKGROUND OF THE INVENTION

1. Field of the Invention

The present invention relates in general to a signal transfer circuit for a synchronous memory device, and more particularly to a signal transfer circuit which is capable of reducing a delay time to transfer an internal address signal at high speed synchronously with a clock signal in a burst mode and of transferring the internal address signal even at a short period of the clock signal.

2. Description of the Prior Art

Generally, semiconductor memory devices such as a synchronous dynamic random access memory (synchronous DRAM or SDRAM) are used synchronously with a clock signal. Such a semiconductor memory device receives the clock signal when a clock enable signal is made active and then processes external input signals synchronously with the received clock signal.

Referring to FIG. 1, there is shown a circuit diagram of a conventional signal transfer circuit for a synchronous memory device. As shown in this drawing, the conventional signal transfer circuit comprises a multiplexing circuit 11 for receiving an external address signal add_ext and an internal address signal add_int from an address counter circuit (not shown). The multiplexing circuit 11 transfers the received external address signal add_axt to an internal circuit 12 in a first mode and it transfers the received internal address signal add_int to the internal circuit 12 in a second mode. The internal circuit 12 is adapted to generate a data signal in response to the external or internal address signal add_ext or add_int transferred by the multiplexing circuit 11 and to transfer the generated data signal to a data output buffer 13. The data output buffer 13 is adapted to buffer the data signal transferred by the internal circuit 12 and to output the buffered data signal externally.

The conventional signal transfer circuit further comprises a multiplexing controller 14 for generating first and second mode control signals in response to a clock signal clk and applying the generated first and second mode control signals to the multiplexing circuit 11, and an output buffer controller 15 for generating an output buffer control signal in response to the clock signal clk and applying the generated output buffer control signal to the data output buffer 13.

The operation of the conventional signal transfer circuit for the synchronous memory device with the above-mentioned construction will hereinafter be described.

The multiplexing controller 14 includes a delay circuit connected between nodes N5 and N7, a NAND gate G3 and an inverter connected in series between the nodes N5 and N7 and a node N8, a first transfer transistor circuit connected between the node N8 and a node N9, and a second transfer transistor circuit connected between the node N8 and a node N10. The first transfer transistor circuit is provided with NMOS and PMOS transistors MN4 and MP4 connected in parallel between the node N8 and the node N9. The second transfer transistor circuit is provided with NMOS and PMOS transistors MN5 and MP5 connected in parallel between the node N8 and the node N10. The delay circuit is provided with three inverters connected in series between the nodes N5 and N7. If the clock signal clk is applied to an input terminal, it is delayed by a predetermined time period through the three inverters connected in series between the nodes N5 and N7 and the supplied to the NAND gate G3. The NAND gate G3 NANDs the delayed clock signal from the three inverters and the clock signal clk from the input terminal. The NANDed result from the NAND gate G3 is inverted by another inverter and then transferred to the multiplexing circuit 11 through the first and second transfer transistor circuits which are operated in response to a control signal sig1.

The multiplexing circuit 11 includes a first transfer transistor circuit for transferring the external address signal add_ext to the internal circuit 12, and a second transfer transistor circuit for transferring the internal address signal add_int from the address counter circuit to the internal circuit 12. The first transfer transistor circuit is provided with PMOS and NMOS transistors MP1 and MN1 which are operated in response to the first output signal from the multiplexing controller 14. The second transfer transistor circuit is provided with PMOS and NMOS transistors MP2 and MN2 which are operated in response to the second output signal from the multiplexing controller 14.

If the external address signal add_ext is applied to a node N1, the multiplexing controller 14 provides its output signal to the output node N9 to turn on the NMOS and PMOS transistors MN1 and MP1 in the multiplexing circuit 11. As a result, the external address signal add_ext from the node N1 is transferred to a node N3 through the turned on NMOS and PMOS transistors MN1 and MP1. In a burst mode employing the internal address signal add_int from the address counter circuit, the multiplexing controller 14 provides its output signal to the output node N10 to turn on the NMOS and PMOS transistors MN2 and MP2 in the multiplexing circuit 11. As a result, the internal address signal add_int from a node N2 is transferred to the node N3 through the turned on NMOS and PMOS transistors MN2 and MP2. The address signal transferred to the node N3 is then applied to the internal circuit 12 which generates a data signal in response to the applied address signal and transfers the generated data signal to the data output buffer 13.

The data output buffer 13 is adapted to output the data signal transferred by the internal circuit 12 to an output terminal N13 in response to a pulse signal from the output buffer controller 15. To this end, the data output buffer 13 includes a pull-up transistor MP3 connected between a supply voltage source Vdd and an output node N13, a pull-down transistor MN3 connected between the output node N13 and a ground voltage source Vss, and NAND gate G1 for NANDing the data signal from the internal circuit 12 and the pulse signal from the output buffer controller 15 and supplying the NANDed result to a gate terminal of the pull-up transistor MP3, and a NOR gate for NORing the data signal from the internal circuit 12 and an inverted one of the pulse signal from the output buffer controller 15 and supplying the NORed result to a gate terminal of the pull-down transistor MN3.

The output buffer controller 15 is adapted to apply the pulse signal to a node N6 in response to the clock signal clk to control the operation of the data output buffer 13.

On the other hand, the external address signal add_ext is applied in the initial mode and the internal address signal add_int from the address counter circuit is applied in the burst mode.

Noticeably, the data access time in the initial mode that the external address signal add_ext is applied is the same as that in the subsequent mode or burst mode that the internal address signal add_int from the address counter circuit is applied. Namely, the data accessing operation is performed in response to the same clock signal in the initial mode and the burst mode. The data accessing operation will hereinafter be described in more detail with reference to FIG. 2.

FIG. 2 is a timing diagram illustrating the operation of the conventional signal transfer circuit in FIG. 1. In this drawing, the reference character ya designates the output address signal from the multiplexing circuit 11, the reference character dly1 designates a delay time required in outputting data to the output terminal in response to the external address signal add__ext, and the reference character dly2 designates a delay time required in outputting data to the output terminal in response to the internal address signal add__int.

As seen from FIG. 2, the delay time dly1 and the delay time dly2 are the same. In other words, in the initial mode that the external address signal add__ext is applied and in the burst mode that the internal address signal add__int from the address counter circuit is applied, data are outputted after the same time from the moment that the clock signal clk is made active.

For this reason, in the burst mode that the internal address signal add__int from the address counter circuit is applied, the delay time required in outputting data in response to the clock signal clk is excessively long, resulting in a degradation in operation speed. Further, in the case where the clock signal clk has a short period, a faulty operation may be caused because of the long delay time.

SUMMARY OF THE INVENTION

Therefore, the present invention has been made in view of the above problems, and it is an object of the present invention to provide a signal transfer circuit for a synchronous memory device which is capable of outputting a data signal after a delay time corresponding to an address path in an initial mode that an external address signal is applied and of outputting the data signal within a short time from a clock signal in a burst mode that an internal address signal is applied.

It is another object of the present invention to provide a signal transfer circuit for a synchronous memory device which is capable of delaying a clock signal with a short period in an initial mode that an external address signal is applied and of directly using the clock signal in a burst mode that an internal address signal is applied.

In accordance with the present invention, the above and other objects can be accomplished by a provision of a signal transfer circuit for a synchronous memory device which has memory cell arrays and the associated peripheral circuits, comprising an input terminal for inputting a clock signal; internal address generation means for generating an internal address signal; multiplexing means for selectively transferring an external address signal and the internal address signal from the internal address generation means; multiplexing control means for controlling the operation of the multiplexing means in response to the clock signal from the input terminal; an internal circuit for generating a data signal in response to the external or internal address signal transferred by the multiplexing means; data output buffer means for buffering the data signal generated by the internal circuit and outputting the buffered data signal externally; output buffer control means for controlling the operation of the data output buffer means in response to the clock signal from the input terminal; switching means connected between the internal circuit and the data output buffer means, for performing a switching operation to transfer the data signal from the internal circuit to the data output buffer means; and switching control means for controlling the operation of the switching means in response to the clock signal from the input terminal.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
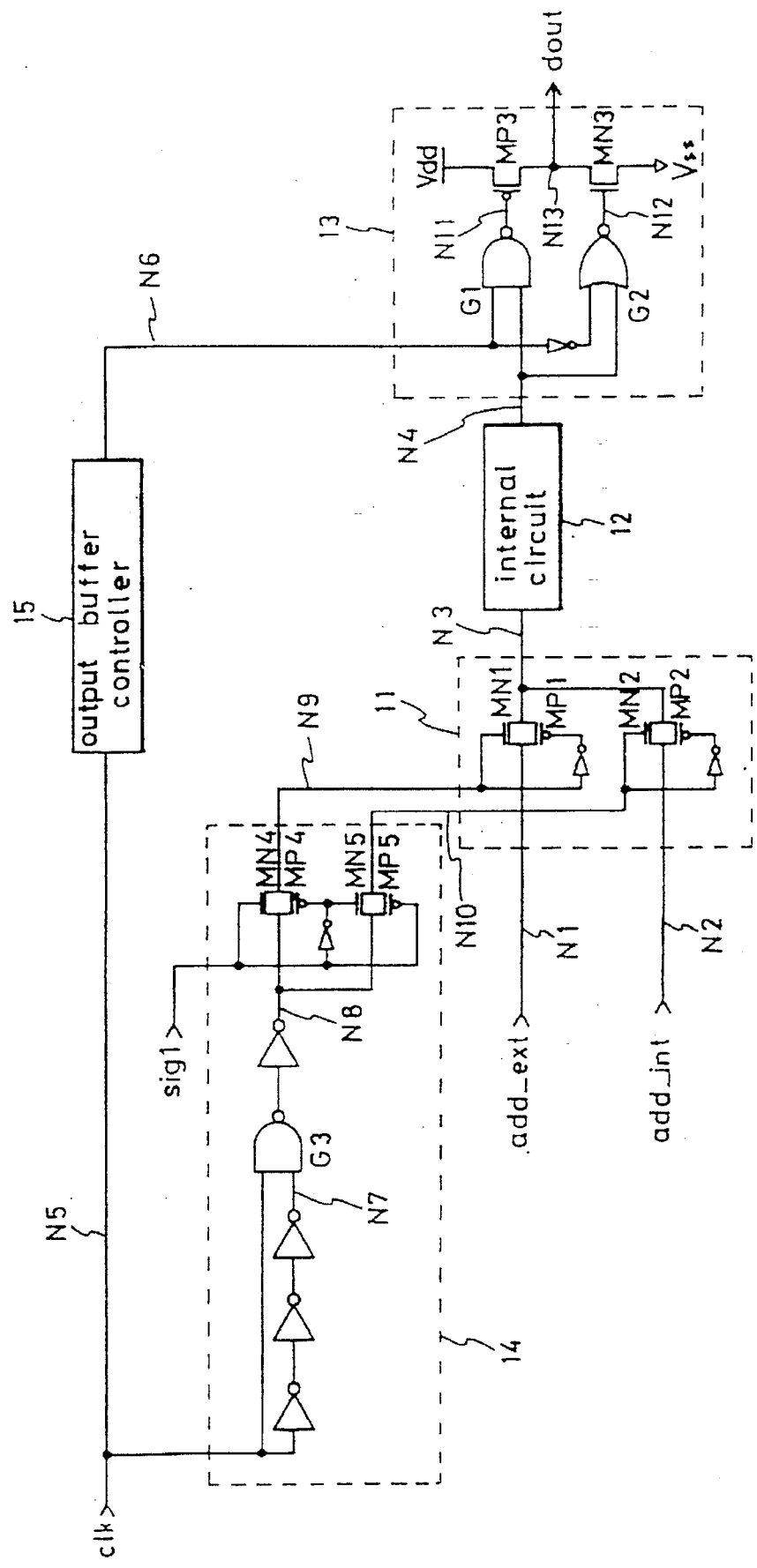
FIG. 1 is a circuit diagram of a conventional signal transfer circuit for a synchronous memory device.
Figure 3:
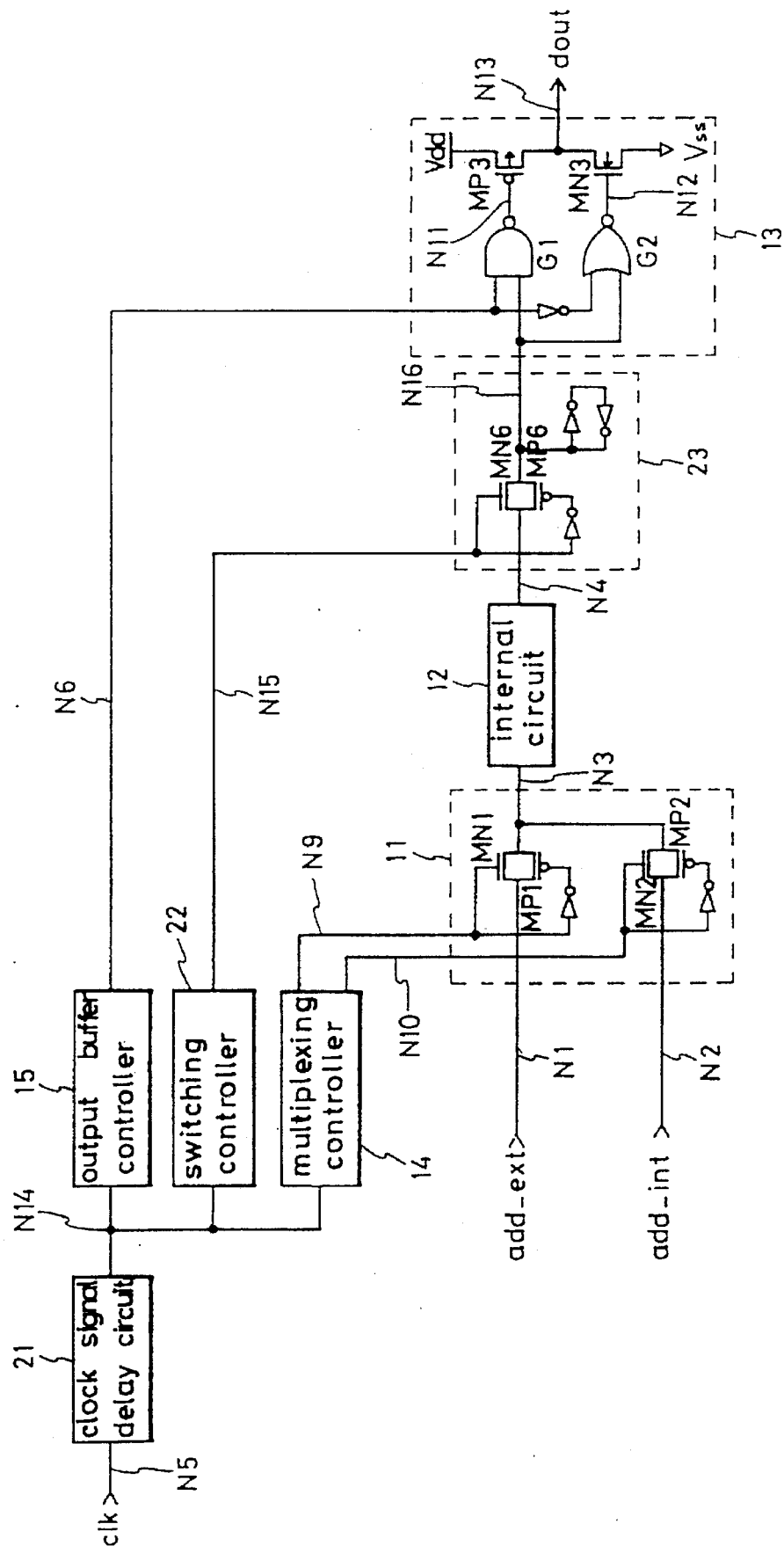
FIG. 3 is a circuit diagram of a signal transfer circuit for a synchronous memory device in accordance with the present invention.

Referring to FIG. 3, there is shown a circuit diagram of a signal transfer circuit for a synchronous memory device in accordance with the present invention. Some parts in this drawing are the same as those in FIG. 1. Therefore, like reference numerals designate like parts.

As shown in FIG. 3, the signal transfer circuit comprises a clock signal delay circuit 21 for delaying the clock signal clk for a predetermined time period. The multiplexing circuit 11 is adapted to receive the external address signal add__ext and the internal address signal add__int from the address counter circuit (not shown). The multiplexing circuit 11 transfers the received external address signal add__ext to the internal circuit 12 in the first mode and it transfers the received internal address signal add__int to the internal circuit 12 in the second mode. The multiplexing controller 14 is adapted to generate first and second mode control signals in response to an output signal from the clock signal delay circuit 21 and to apply the generated first and second mode control signals to the multiplexing circuit 11. The internal circuit 12 is adapted to generate a data signal in response to the external or internal address signal add__ext or add__int external or internal address signal add__int add_int transferred by the multiplexing circuit 11 and to transfer the generated data signal to the data output buffer 13. The data output buffer 13 is adapted to buffer the data signal transferred by the internal circuit 12 and to output the buffered data signal externally. The output buffer controller 15 is adapted to generate an output buffer control signal in response to the output signal from the clock signal delay circuit 21 and to apply the generated output buffer control signal to the data output buffer 13.

The signal transfer circuit further comprises a switching circuit 23 connected between the internal circuit 12 and the data output buffer 13, for performing a switching operation to transfer the data signal from the internal circuit 12 to the data output buffer 13, and a switching controller 22 for controlling the switching operation of the switching circuit 23 in response to the output signal from the clock signal delay circuit 21.

The switching circuit 23 includes PMOS and NMOS transistors MP6 and MN6 connected in parallel between nodes N4 and N16. The NMOS transistor MN6 has its gate terminal for inputting a signal at a node N15 and the PMOS transistor MP6 has its gate terminal for inputting an inverted one of the signal at the node N15. The switching circuit 23 further includes a latch circuit for maintaining the data signal from the internal circuit 12 at the node N16.

In accordance with the present invention, the signal transfer circuit with the above-mentioned construction can perform various operations depending on methods for producing the control signals to the multiplexing circuit 11.

In the initial mode, the external address signal add_ext at the node N1 is transferred to the internal circuit 12 in response to the clock signal clk. In the burst mode, the internal address signal add_int from the address counter circuit is transferred to the internal circuit 12 after a predetermined delay time from the clock signal clk.

Noticeably, two methods can be proposed to allow the data output buffer 13 to output the data signal in response to the internal address signal add_int from the address counter circuit. In one method, the data output buffer 13 outputs the data signal in response to the internal address signal add_int depending on a delayed one of the clock signal clk. In the other method, the data output buffer 13 outputs the data signal in response to the internal address signal add_int depending on the clock signal clk, not delayed. The above two methods will hereinafter be described in more detail with reference to FIGS. 4 and 5.

Figure 4:
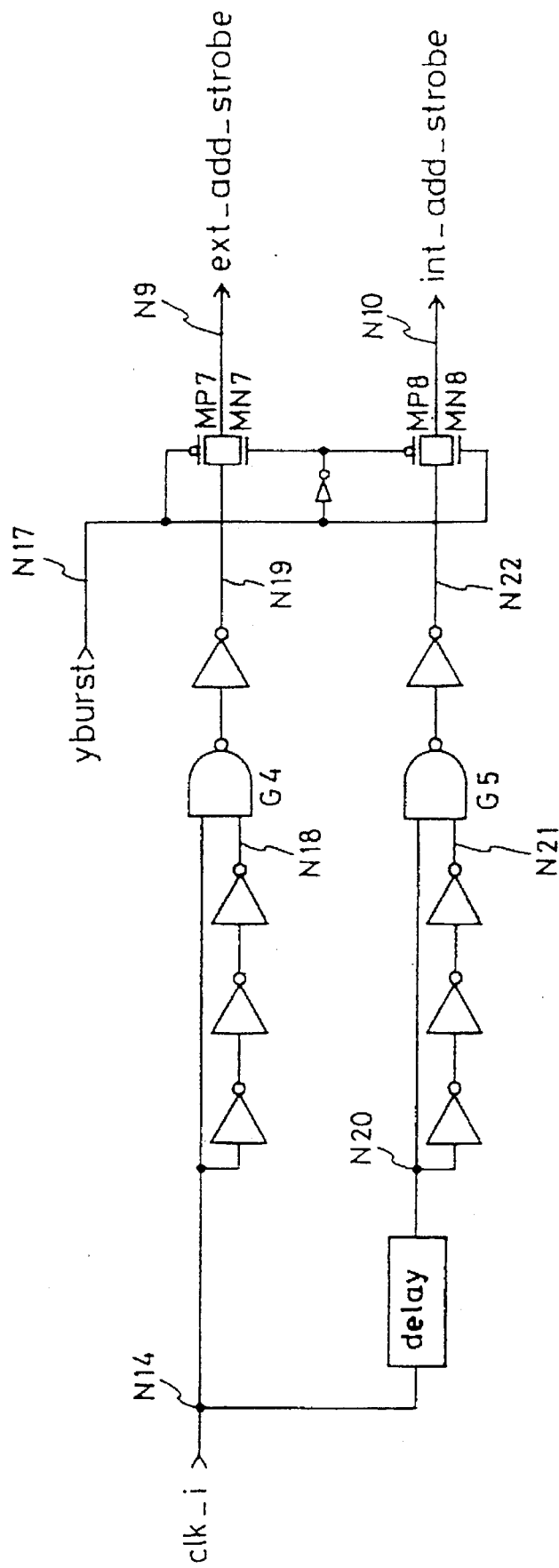
FIG. 4 is a circuit diagram of an embodiment of a multiplexing controller in FIG. 3 in accordance with the present invention.

FIG. 4 is a circuit diagram of an embodiment of the multiplexing controller 14 in FIG. 3 in accordance with the present invention. The multiplexing controller 14 is adapted to transfer the internal address signal add_int from the address counter circuit to the internal circuit 12 in response to a delayed one of the clock signal clk.

As shown in FIG. 4, the multiplexing controller 14 includes three inverters connected in series between a node N14 and a node N18, a NAND gate G4 for NANDing a clock signal clk_i at the node N14 and a signal at the node N18, and an inverter for inverting an output signal from the NAND gate G4 and outputting the inverted signal to a node N19.

The multiplexing controller 14 further includes a delay circuit connected between the node N14 and a node N20, three inverters connected in series between the node N20 and a node N21, a NAND gate G5 for NANDing signals at the node N20 and N21, and an inverter for inverting an output signal from the NAND gate G5 and outputting the inverted signal to a node N22.

The multiplexing controller 14 further includes a first transfer transistor circuit connected between the nodes N19 and N9, and a second transfer transistor circuit connected between the node N22 and the node N10. The first transfer transistor circuit is provided with PMOS and NMOS transistors MP7 and MN7 connected in parallel between the nodes N19 and N9. The second transfer transistor circuit is provided with PMOS and NMOS transistors MP8 and MN8 connected in parallel between the nodes N22 and N10.

The operation of the embodiment of the multiplexing controller 14 with the above-mentioned construction in accordance with the present invention will hereinafter be described in detail.

The three inverters connected in series between the nodes N14 and N18 delay the clock signal clk_i at the node N14 for a predetermined time period. The clock signal clk_i is the output signal from the clock signal delay circuit 21 which delays the clock signal clk. The NAND gate G4 NANDs the delayed clock signal from the three inverters and the clock signal clk_i at the node N14. The NANDed result from the NAND gate G4 is inverted by another inverter and then transferred to the node N19. A pulse signal at the node N19 is transferred to the node N9 through the first transfer transistor circuit which is provided with the PMOS and NMOS transistors MP7 and MN7 connected in parallel between the nodes N19 and N9.

The clock signal clk_i at the node N14 is also delayed for a predetermined time period by the delay circuit connected between the node N14 and the node N20. The delayed clock signal from the delay circuit is again delayed for a predetermined time period by the three inverters connected in series between the node N20 and the node N21. The NAND gate G5 NANDs the delayed clock signal from the three inverters and the delayed clock signal from the delay circuit. The NANDed result from the NAND gate G5 is inverted by another inverter and then transferred to the node N22. A pulse signal at the node N22 is transferred to the node N10 through the second transfer transistor circuit which is provided with the PMOS and NMOS transistors MP8 and MN8 connected in parallel between the nodes N22 and N10.

The PMOS and NMOS transistors MP7 and MN7 and MP8 and MN8 of the first and second transfer transistor circuits are operated in response to a burst mode control signal yburst at a node N17.

In the initial mode that the external address signal add_ext is applied, the multiplexing controller 14 outputs a control signal ext_add_strobe to the node N9 in response to the clock signal clk_i at the node N14 to turn on the PMOS and NMOS transistors MP1 and MN1 of the transfer transistor circuit connected between the nodes N1 and N3. When a predetermined time period has elapsed, the multiplexing controller 14 outputs a control signal int_add_strobe to the node N10 to turn on the PMOS and NMOS transistors MP2 and MN2 of the transfer transistor circuit connected between the nodes N2 and N3.

In the case where the external address signal add_ext is not applied, the multiplexing controller 14 outputs the control signal int_add_strobe to the node N10 to turn on the PMOS and NMOS transistors MP2 and MN2 of the transfer transistor circuit connected between the nodes N2 and N3. As a result, the internal address signal add_int from the address counter circuit is transferred to the internal circuit 12 through the turned on PMOS and NMOS transistors MP2 and MN2.

Figure 5:
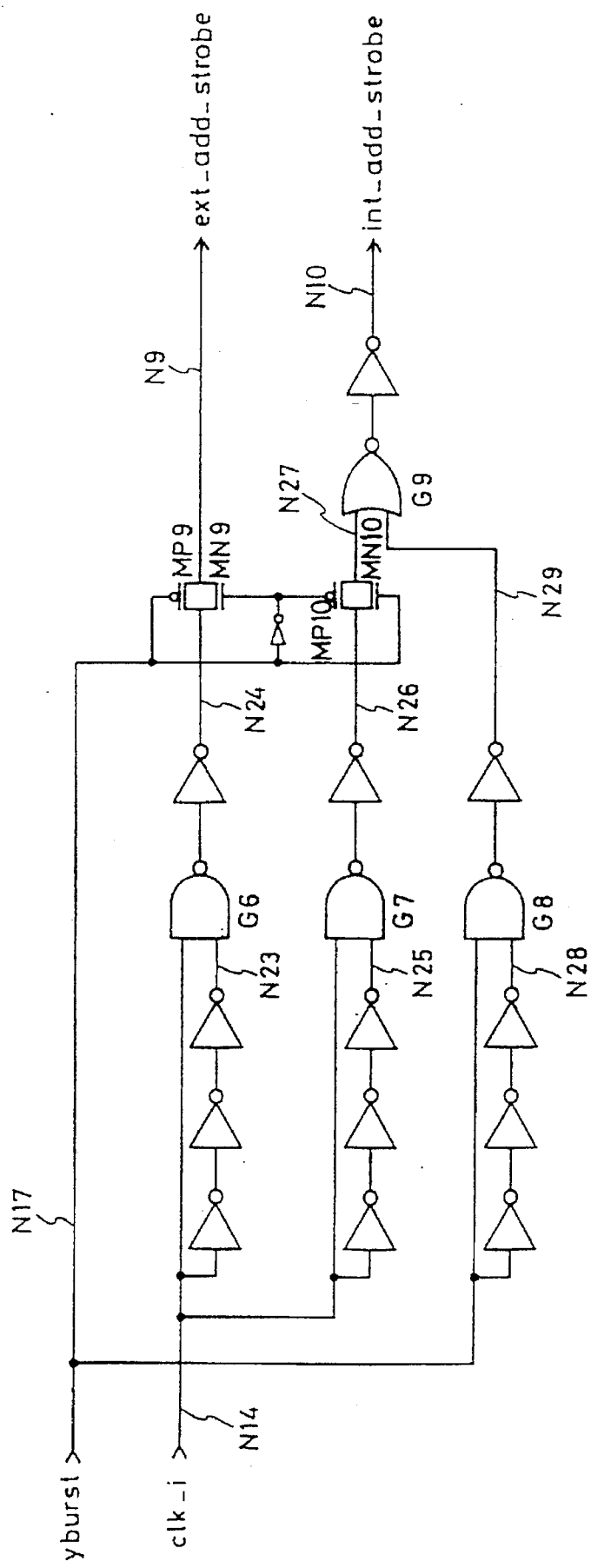
FIG. 5 is a circuit diagram of an alternative embodiment of a multiplexing controller in FIG. 3 in accordance with the present invention.

FIG. 5 is a circuit diagram of an alternative embodiment of the multiplexing controller 14 in FIG. 3 in accordance with the present invention. As shown in this drawing, the multiplexing controller 14 includes three inverters connected in series between the node N14 and a node N23, a NAND gate G6 for NANDing the clock signal clk_i at the node N14 and a signal at the node N23, and an inverter for inverting an output signal from the NAND gate G6 and outputting the inverted signal to a node N24.

The multiplexing controller 14 further includes three inverters connected in series between the node N14 and a node N25, a NAND gate G7 for NANDing the clock signal clk_i at the node N14 and a signal at the node N25, and an inverter for inverting an output signal from the NAND gate G7 and outputting the inverted signal to a node N26.

The multiplexing controller 14 further includes three inverters connected in series between the node N17 and a node N28, a NAND gate G8 for NANDing the burst mode control signal yburst at the node N17 and a signal at the node N28, and an inverter for inverting an output signal from the NAND gate G8 and outputting the inverted signal to a node N29.

The multiplexing controller 14 further includes a first transfer transistor circuit connected between the nodes N24 and N9, and a second transfer transistor circuit connected between the node N26 and a node N27. The first transfer transistor circuit is provided with PMOS and NMOS transistors MP9 and MN9 connected in parallel between the nodes N24 and N9. The second transfer transistor circuit is provided with PMOS and NMOS transistors MP10 and MN10 connected in parallel between the nodes N26 and N27.

The multiplexing controller 14 further includes a NOR gate G9 for NORing signals at the nodes N27 and N29, and an inverter for inverting an output signal from the NOR gate G9 and outputting the inverted signal to the node N10. The NMOS transistors MP9 and MN10 have their gate terminals for inputting the burst mode control signal yburst at the node N17 and the NMOS transistors MN9 and MP10 have their gate terminals for inputting an inverted one of the burst mode control signal yburst at the node N17.

The operation of the multiplexing controller 14 in FIG. 5 is substantially the same as that in FIG. 4 and a detailed description thereof will thus be omitted. Noticeably, in the initial mode that the external address signal add_ext is applied, the multiplexing controller 14 transfers the external address signal add_ext to the internal circuit 12 in response to the delayed clock signal clk_i. In the burst mode that the internal address signal add_int from the address counter circuit is applied, the multiplexing controller 14 transfers the internal address signal add_int to the internal circuit 12 in response to the clock signal clk, not delayed.

Upon receiving the address signal transferred from the multiplexing circuit 11 under the control of the multiplexing controller 14, the internal circuit 12 outputs the data signal corresponding to the transferred address signal after a predetermined delay time.

Assuming that a delay time required in outputting the data signal in response to the external address signal add_ext is dly1, a delay time required in outputting the data signal in response to the internal address signal add_int is the delay time dly1 after the data signal is outputted in response to the external address signal add_ext. Also, assuming that a delay time required in transferring the internal address signal add_int from the address counter circuit to the internal circuit 12 through the multiplexing circuit 11 is dly2, the data signal is outputted after a delay time of dly1+dly2.

Figure 6:
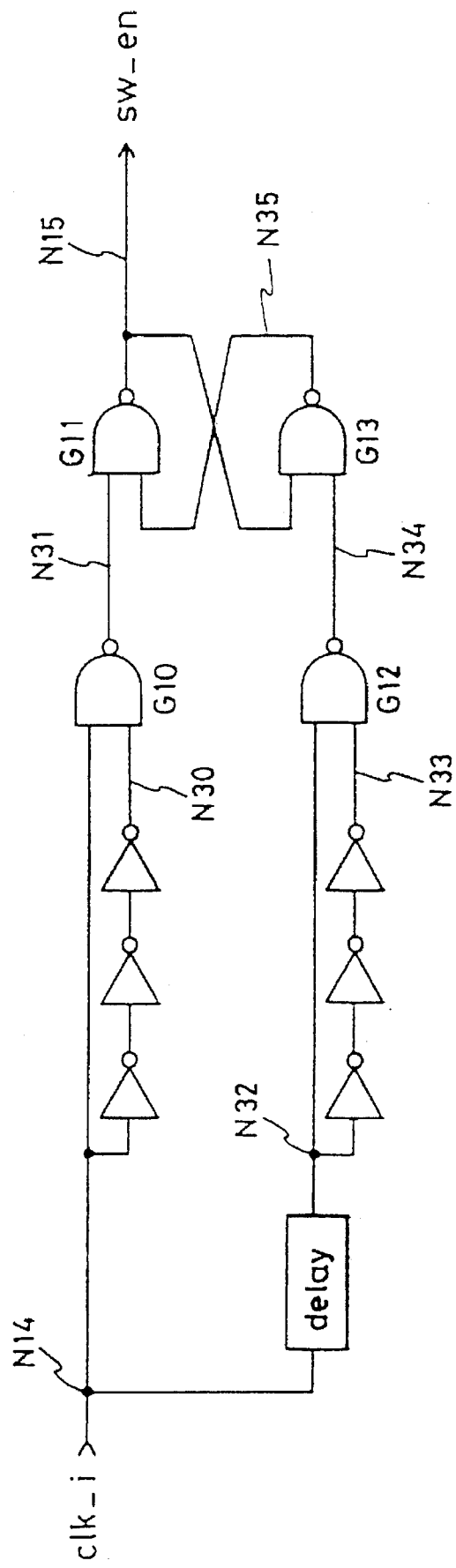
FIG. 6 is a circuit diagram of an embodiment of a switching controller in FIG. 3 in accordance with the present invention.
Figure 7:
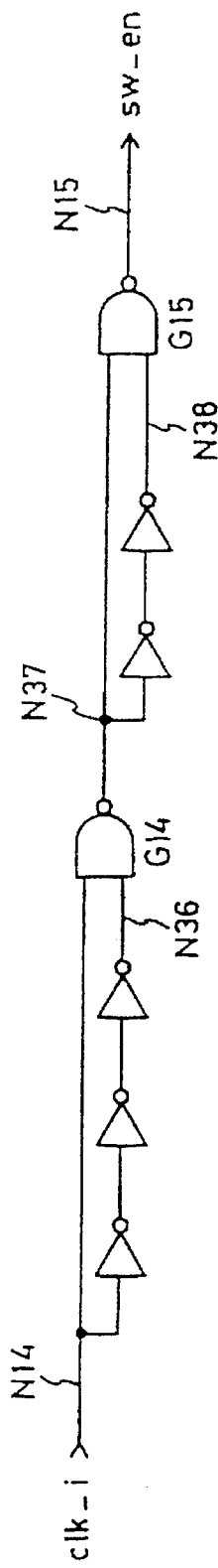
FIG. 7 is a circuit diagram of an alternative embodiment of a switching controller in FIG. 3 in accordance with the present invention.
Figure 8:
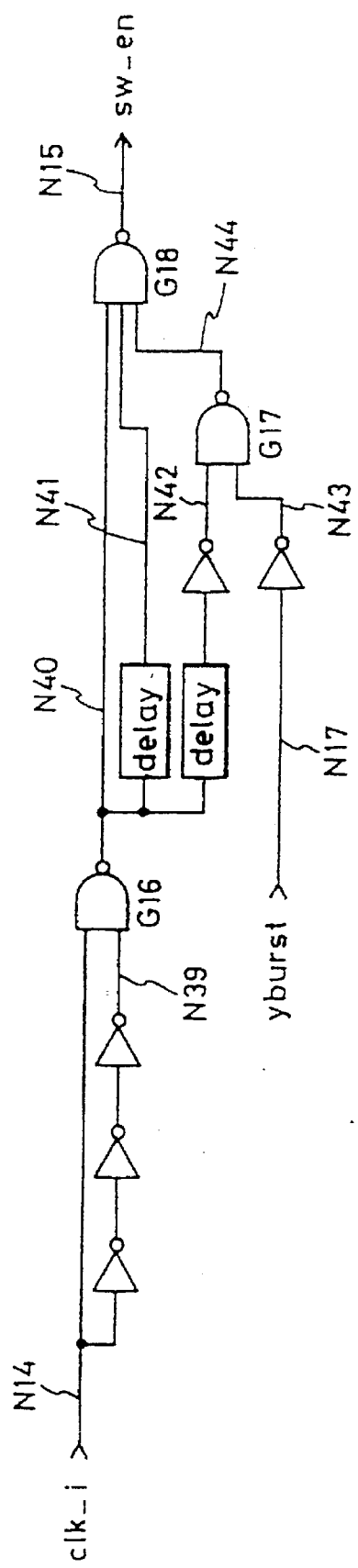
FIG. 8 is a circuit diagram of another embodiment of a switching controller in FIG. 3 in accordance with the present invention.

FIGS. 6 to 8 show various embodiments of the switching controller 22 in FIG. 3 in accordance with the present invention. The switching controller 22 is adapted to control the switching operation of the switching circuit 23 after a predetermined delay time from the clock signal clk.

FIG. 6 is a circuit diagram of a first embodiment of the switching controller 22 in FIG. 3 in accordance with the present invention. As shown in this drawing, the switching controller 22 includes three inverters connected in series between the node N14 and a node N30, a NAND gate G10 for NANDing the clock signal clk_i at the node N14 and a signal at the node N30 and outputting the NANDed result to a node N31, a delay circuit connected between the node N14 and a node N32, three inverters connected in series between the node N32 and a node N33, a NAND gate G12 for NANDing signals at the nodes N32 and N33 and outputting the NANDed result to a node N34, and a latch circuit connected between the nodes N31 and N34 and the node N15. The latch circuit is provided with two NAND gates G11 and G13.

The operation of the first embodiment of the switching controller 22 with the above-mentioned construction in accordance with the present invention will hereinafter be described in detail.

The three inverters connected between the nodes N14 and N30 and the NAND gate G10 cooperate to generate a pulse signal at the node N31 when the clock signal clk_i at the node N14 makes a first to second state transition. The three inverters connected between the nodes N32 and N33 and the NAND gate G12 cooperate to generate a pulse signal at the node N34 when the delayed clock signal at the node N32 makes the first to second state transition. Then, the latch circuit latches the pulse signals at the nodes N31 and N34 and outputs the latched result as a switching control signal sw_en to the switching circuit 23.

In the case where time required in transferring the internal address signal add_int from the address counter circuit to the internal circuit 12 is longer than that required in transferring the external address signal add_ext to the internal circuit 12, the switching controller 22 delays the clock signal clk in the initial mode that the external address signal add_ext is applied. As a result, the period of the clock signal clk becomes longer in the initial mode. In the burst mode that the internal address signal add_int from the address counter circuit is applied, the switching controller 22 maintains the clock signal clk as it is. As a result, in the burst mode, the signal transfer operation can be performed even at a short period of the clock signal clk.

Under the control of the switching controller 22, the switching circuit 23 is operated between the time dly1 and the time dly1+dly2 to transfer the data signal corresponding to the external address signal add_ext to data output buffer 14. Then, the switching circuit 23 is operated at the subsequent clock to transfer the data signal corresponding to the internal address signal add_int.

FIG. 7 is a circuit diagram of a second embodiment of the switching controller 22 in FIG. 3 in accordance with the present invention. As shown in this drawing, the switching controller 22 includes three inverters connected in series between the node N14 and a node N36, a NAND gate G14 for NANDing the clock signal clk_i at the node N14 and a signal at the node N36 and outputting the NANDed result to a node N37, two inverters connected in series between the node N37 and a node N38, and a NAND gate G15 for NANDing signals at the nodes N37 and N38 and outputting the NANDed result to the node N15.

The operation of the second embodiment of the switching controller 22 with the above-mentioned construction in accordance with the present invention will hereinafter be described in detail.

The three inverters connected between the nodes N14 and N36 and the NAND gate G14 cooperate to delay the clock signal clk_i at the node N14 and to generate a pulse signal at the node N37 when the delayed clock signal makes the first to second state transition. The two inverters connected between the nodes N37 and N38 and the NAND gate G15 cooperate to delay the pulse signal at the node N37 and to generate a pulse signal at the node N15 when the delayed pulse signal makes the first to second state transition.

FIG. 8 is a circuit diagram of a third embodiment of the switching controller 22 in FIG. 3 in accordance with the present invention. As shown in this drawing, the switching controller 22 includes three inverters connected in series between the node N14 and a node N39, a NAND gate G16 for NANDing the clock signal clk_i at the node N14 and a signal at the node N39 and outputting the NANDed result to a node N40, a delay circuit connected between the node N40 and a node N41, a delay circuit and an inverter connected in series between the node N40 and a node N42, an inverter connected between the node N17 and a node N43, a NAND gate G17 for NANDing signals at the nodes N42 and N43 and outputting the NANDed result to a node N44, and a NAND gate G18 for NANDing signals at the nodes N40, N41 and N44 and outputting the NANDed result to the node N15.

The operation of the third embodiment of the switching controller 22 with the above-mentioned construction in accordance with the present invention will hereinafter be described in detail.

The three inverters connected between the nodes N14 and N39 and the NAND gate G16 cooperate to delay the clock signal clk_i at the node N14 and to generate a pulse signal at the node N40 when the delayed clock signal makes the first to second state transition.

The NAND gate G18 NANDs the pulse signal at the node N40, the delayed pulse signal at the node N41 and the output signal from the NAND gate G17 and generates a pulse signal at the node N15. The switching circuit 23 is operated when the pulse signal at the node N15 is enabled and it is not operated when the pulse signal at the node N15 is disabled.

Figure 9:
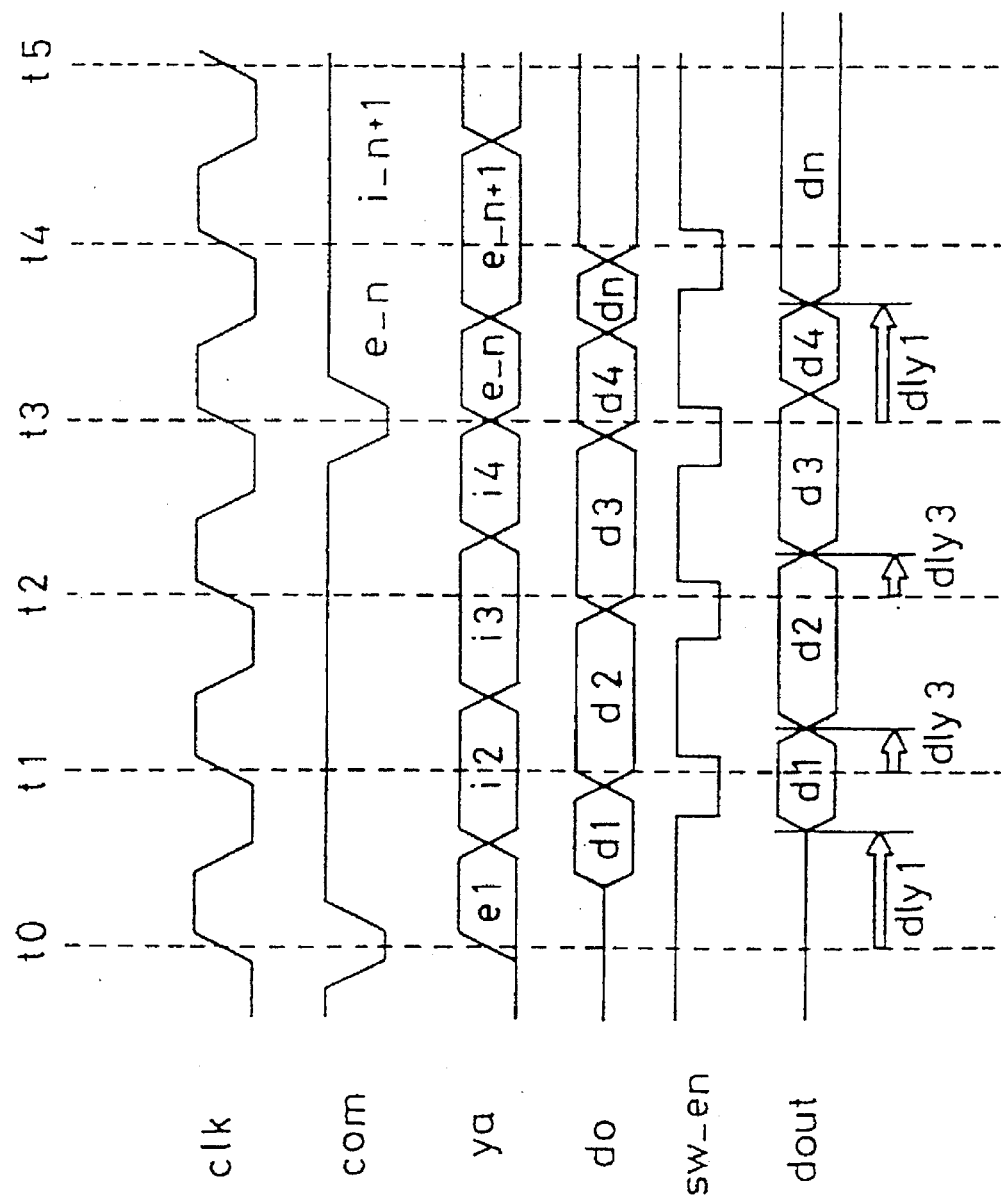
FIG. 9 is a timing diagram illustrating the operation of the signal transfer circuit in accordance with the present invention in the case where a clock signal delay circuit is not present in FIG. 3.
Figure 10:
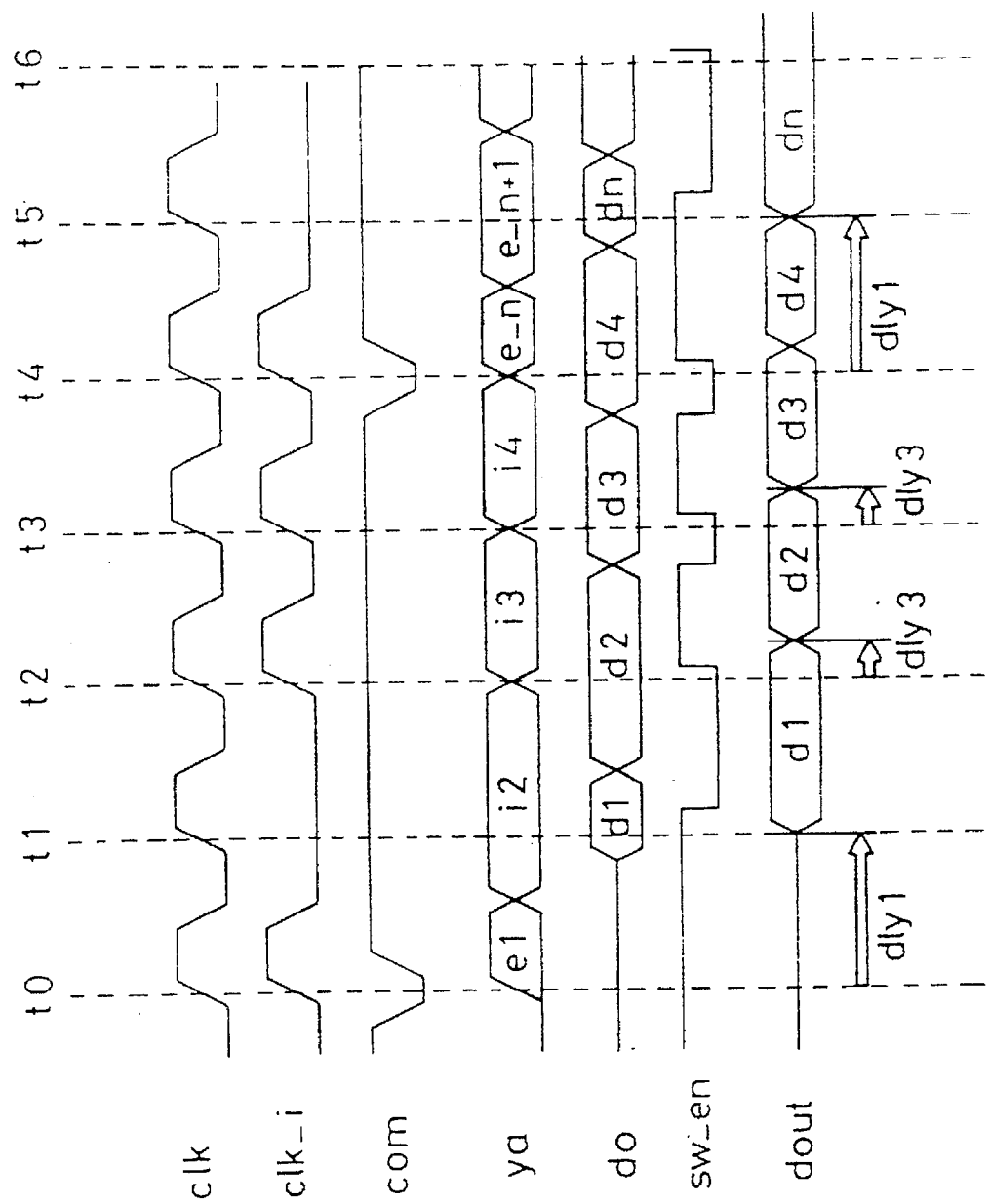
FIG. 10 is a timing diagram illustrating the operation of the signal transfer circuit in accordance with the present invention in the case where the clock signal delay circuit is present in FIG. 3.

FIG. 9 is a timing diagram illustrating the operation of the signal transfer circuit in accordance with the present invention in the case where the clock signal delay circuit 21 is not present in FIG. 3, and FIG. 10 is a timing diagram illustrating the operation of the signal transfer circuit in accordance with the present invention in the case where the clock signal delay circuit 21 is present in FIG. 3.

In FIGS. 9 and 10, the reference character ya designates the output address signal from the multiplexing circuit 11 and the reference character do designates the output data pulse signal from the switching circuit 23.

Figure 2:
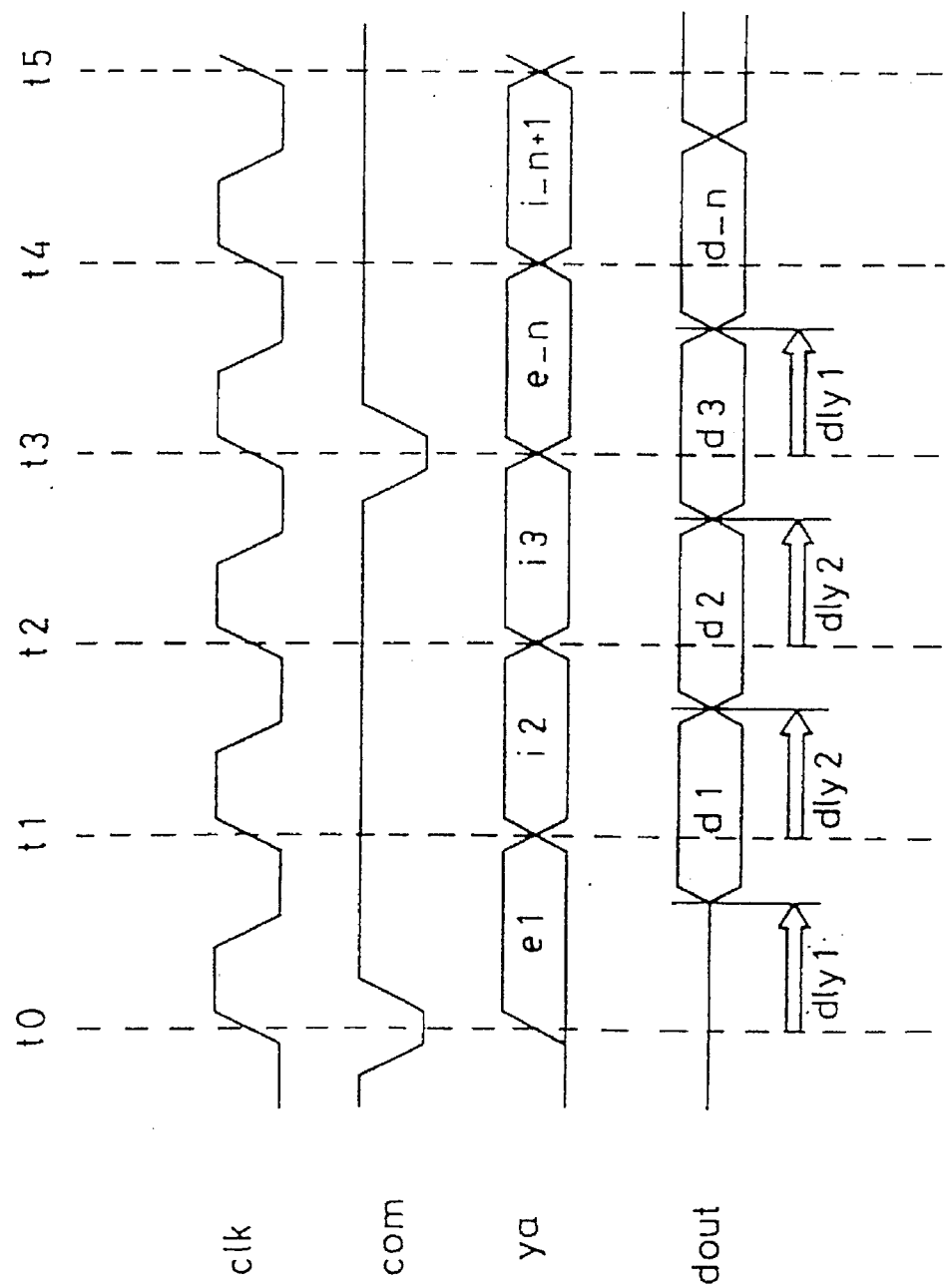
FIG. 2 is a timing diagram illustrating the operation of the conventional signal transfer circuit in FIG. 1.

As seen from FIGS. 9 and 10, after the external address signal add_ext is transferred in response to the clock signal clk, the access time dly3 based on the internal address signal add_int at the subsequent clock is much shorter than that in FIG. 2.

Namely, the external address signal add_ext is transferred in response to the delayed clock signal and the internal address signal add_int from the address counter circuit is then transferred in response to the clock signal, not delayed. In this case, in the initial mode that the external address signal add_ext is applied, the switching devices in the switching circuit 23 are turned off after a long delay time. In the burst mode that the internal address signal add_int from the address counter circuit is applied, the switching devices in the switching circuit 23 are turned off after a short delay time.

As apparent from the above description, according to the present invention, the data signal can be outputted within a short time from the clock signal in the burst mode that the internal address signal is applied. Further, in the case where the clock signal has a short period, it is delayed in the initial mode that the external address signal is applied and it is directly used in the burst mode that the internal address signal is applied. Therefore, the present invention has the effect of enabling the high-speed operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A signal transfer circuit for a synchronous memory device which has memory cell arrays and the associated peripheral circuits, comprising:

an input terminal for inputting a clock signal;

internal address generation means for generating an internal address signal;

multiplexing means for selectively transferring an external address signal and the internal address signal from said internal address generation means;

multiplexing control means for controlling the operation of said multiplexing means in response to the clock signal from said input terminal;

an internal circuit for generating a data signal in response to the external or internal address signal transferred by said multiplexing means;

data output buffer means for buffering the data signal generated by said internal circuit and outputting the buffered data signal externally;

output buffer control means for controlling the operation of said data output buffer means in response to the clock signal from said input terminal;

switching means connected between said internal circuit and said data output buffer means, for performing a switching operation to transfer the data signal from said internal circuit to said data output buffer means; and switching control means for controlling the operation of said switching means in response to the clock signal from said input terminal.

2. A signal transfer circuit for a synchronous memory device, as set forth in claim 1, further comprising clock signal delay means connected to said input terminal, for delaying the clock signal from said input terminal and supplying the delayed clock signal to said output buffer control means, said switching control means and said multiplexing control means.

3. A signal transfer circuit for a synchronous memory device, as set forth in claim 2, wherein said clock signal delay means is adapted to delay the clock signal from said input terminal by n clocks after the external address signal is applied, where n is 1, 2, 3, . . . , .

4. A signal transfer circuit for a synchronous memory device, as set forth in claim 2, wherein said clock signal delay means is adapted to delay the delay signal from said input terminal in the case where the subsequent clock is generated before the data signal from said internal circuit based on the external address signal is arrived at said data output buffer means.

5. A signal transfer circuit for a synchronous memory device, as set forth in claim 1, wherein said multiplexing means includes:
- a first switching device connected between an input terminal for inputting the external address signal and said internal circuit; and
- a second switching device connected between said internal address generation means and said internal circuit.

6. A signal transfer circuit for a synchronous memory device, as set forth in claim 5, wherein each of said first and second switching devices includes a PMOS transistor and an NMOS transistor connected in parallel to each other.

7. A signal transfer circuit for a synchronous memory device, as set forth in claim 5, wherein said multiplexing control means is adapted to turn on said first switching device in response to the clock signal from said input terminal and to turn on said second switching device after a predetermined delay time, in an initial mode that the external address signal is applied, and to turn on only said second switching device in response to a delayed one of the clock signal from said input terminal in a burst mode that the internal address signal from said internal address generation means is applied.

8. A signal transfer circuit for a synchronous memory device, as set forth in claim 2, wherein said multiplexing control means includes:
- an odd number of first inverters connected in series between an output terminal of said clock signal delay means and a first node;
- a first NAND gate for NANDing the delayed clock signal from said clock signal delay means and a pulse signal at said first node;
- a second inverter for inverting an output signal from said first NAND gate;
- a delay circuit connected between said output terminal of said clock signal delay means and a second node;
- an odd number of third inverters connected in series between said second node and a third node;
- a second NAND gate for NANDing pulse signals at said second and third nodes;
- a fourth inverter for inverting an output signal from said second NAND gate;
- first PMOS and NMOS transistors connected in parallel between an output terminal of said second inverter and said multiplexing means; and
- second PMOS and NMOS transistors connected in parallel between an output terminal of said fourth inverter and said multiplexing means, said first and second PMOS and NMOS transistors being operated in response to a burst mode control signal.

9. A signal transfer circuit for a synchronous memory device, as set forth in claim 2, wherein said multiplexing control means includes:
- an odd number of first inverters connected in series between an output terminal of said clock signal delay means and a first node;
- a first NAND gate for NANDing the delayed clock signal from said clock signal delay means and a pulse signal at said first node;
- a second inverter for inverting an output signal from said first NAND gate;
- an odd number of third inverters connected in series between said output terminal of said clock signal delay means and a second node;
- a second NAND gate for NANDing the delayed clock signal from said clock signal delay means and a pulse signal at said second node;
- a fourth inverter for inverting an output signal from said second NAND gate;
- an odd number of fifth inverters connected in series between an input terminal for inputting a burst mode control signal and a third node;
- a third NAND gate for NANDing the burst mode control signal from said input terminal and a pulse signal at said third node;
- a sixth inverter for inverting an output signal from said third NAND gate;
- first PMOS and NMOS transistors connected in parallel between an output terminal of said second inverter and said multiplexing means;
- second PMOS and NMOS transistors connected in parallel between an output terminal of said fourth inverter and a fourth node;
- a NOR gate for NORing an output signal from said sixth inverter and a signal at said fourth node; and
- a seventh inverter for inverting an output signal from said NOR gate and outputting the inverted signal to said multiplexing means.

10. A signal transfer circuit for a synchronous memory device, as set forth in claim 1, wherein said switching means includes a transfer transistor circuit, said transfer transistor circuit having a PMOS transistor and an NMOS transistor connected in parallel between said internal circuit and said data output buffer means.

11. A signal transfer circuit for a synchronous memory device, as set forth in claim 10, wherein said switching means further includes a latch circuit connected to an output terminal of said transfer transistor circuit, for maintaining the data signal from said internal circuit.

12. A signal transfer circuit for a synchronous memory device, as set forth in claim 4, wherein said switching control means includes:
- a first edge detector for generating a first pulse signal when the delayed clock signal from said clock signal delay means makes a first to second state transition;
- a second edge detector for generating a second pulse signal when the delayed clock signal from said clock signal delay means makes the first to second state transition; and
- a latch circuit for latching the first and second pulse signals from said first and second edge detectors and outputting the latched result as a switching control signal to said switching means.

13. A signal transfer circuit for a synchronous memory device, as set forth in claim 12, wherein each of said first and second edge detectors includes a delay chain and a logic gate for cooperating to delay the delayed clock signal from said clock signal delay means for a predetermined time period to generate the first or second pulse signal.

14. A signal transfer circuit for a synchronous memory device, as set forth in claim 4, wherein said switching control means includes:
- a first edge detector for generating a first pulse signal when the delayed clock signal from said clock signal delay means makes a first to second state transition; and
- a second edge detector for generating a second pulse signal in response to the first pulse signal from said first edge detector and a delayed one of the first pulse signal from said first edge detector and outputting the generated second pulse signal as a switching control signal to said switching means.

15. A signal transfer circuit for a synchronous memory device, as set forth in claim 14, wherein said first edge detector includes a delay chain and a logic gate for cooperating to delay the delayed clock signal from said clock signal delay means for a predetermined time period to generate the first pulse signal.

16. A signal transfer circuit for a synchronous memory device, as set forth in claim 14, wherein said second edge detector includes a delay chain and a logic gate for cooperating to delay the first pulse signal from said first edge detector for a predetermined time period to generate the second pulse signal.

17. A signal transfer circuit for a synchronous memory device, as set forth in claim 4, wherein said switching control means includes:

a first edge detector for generating a first pulse signal when the delayed clock signal from said clock signal delay means makes a first to second state transition; and a second edge detector for generating a second pulse signal in response to the first pulse signal from said first edge detector, to a delayed one of the first pulse signal from said first edge detector and to a signal obtained by NANDing an inverted one of the delayed first pulse signal and an inverted burst mode control signal, and for outputting the generated second pulse signal as a switching control signal to said switching means.

18. A signal transfer circuit for a synchronous memory device, as set forth in claim 17, wherein said first edge detector includes a delay chain and a logic gate for cooperating to delay the delayed clock signal from said clock signal delay means for a predetermined time period to generate the first pulse signal.

* * * * *